United States Patent [19]

Bender et al.

[11] Patent Number: 4,599,154
[45] Date of Patent: Jul. 8, 1986

[54] ELECTRICALLY ENHANCED LIQUID JET PROCESSING

[75] Inventors: David L. Bender, Thousand Oaks; Kim W. Mitchell, Granada Hills, both of Calif.

[73] Assignee: Atlantic Richfield Company, Los Angeles, Calif.

[21] Appl. No.: 712,299

[22] Filed: Mar. 15, 1985

[51] Int. Cl.[4] ............................ C25F 3/04; C25F 3/14
[52] U.S. Cl. ............................ 204/129.6; 204/129.75
[58] Field of Search ........................ 204/129.6, 129.75

[56] References Cited

U.S. PATENT DOCUMENTS

| | | | |
|---|---|---|---|
| 2,799,637 | 7/1957 | Williams | 204/129.6 |
| 2,958,636 | 11/1960 | Hershinger | 204/129.6 |
| 4,292,092 | 9/1981 | Hanak | 148/1.5 |
| 4,315,096 | 2/1982 | Tyan | 136/244 |

OTHER PUBLICATIONS

Electrochemical Technology, vol. 1, No. 7-8, Jul.-Aug. 1963, pp. 203-210.

Primary Examiner—T. M. Tufariello
Attorney, Agent, or Firm—Albert C. Metrailer

[57] ABSTRACT

An electrically enhanced liquid jet process particularly adapted for forming scribe lines on thin film material deposited during fabrication of thin film solar cell devices. A narrow jet of liquid solution is directed onto a thin film along a desired line while an electrical current is passed through the liquid jet and the film being processed. The liquid solution is selected to remove material along the desired line only at its point of contact with the film but to be substantially nonreactive with the film in all other areas where there is an absence of electrical enhancement.

5 Claims, 2 Drawing Figures

4,599,154

ELECTRICALLY ENHANCED LIQUID JET PROCESSING

BACKGROUND OF THE INVENTION

The present invention relates to the manufacture of thin film solar cells and more specifically to the use of an electrically enhanced liquid jet etch process.

References which illustrate the basic structures of thin film solar cells relevant to the present invention include the Hanak U.S. Pat. No. 4,292,092 and the Tyan et al U.S. Pat. No. 4,315,096. Both of these patents are hereby incorporated by reference for all purposes.

As discussed in the two above referenced patents, the series resistance of transparent conductors used on at least the light receiving faces of such thin film solar cells causes a problem where high efficiency or power output is desired. Practical devices have therefore been formed of a large number of serially connected cells. The individual cells are formed on a large substrate by scribing various layers. There are generally three sets layers to be scribed. These include the light receiving face transparent conductor, the actual semiconductor layer, and the back contact which is usually a metal such as aluminum, but which may also be transparent if desired. Each of these layers is deposited as a continuous sheet which is then separated into an appropriate section for each cell by scribing the continuous layer. As discussed in the two above referenced patents, both mechanical scribing and laser scribing have been used. The laser scribing techniques are considered the point of novelty in the Hanak patent.

Mechanical scribing has been found to be difficult or impossible to apply on a production basis. The transparent conductor is usually tin oxide which is quite hard and brittle. It is usually applied directly to a glass substrate. Scribing methods which are capable of cutting through the tin oxide can also cut into the glass substrate. In similar fashion, it is difficult to scribe through semiconductor layers, such as silicon, without also scribing through an underlying tin oxide layer. Other problems are encountered when a back contact made of aluminum is scribed with a mechanical device. The metal contact is relatively soft and therefore easy to cut through, but tends to smear and leave behind a thin layer of metal in the scribe line, thereby electrically shorting adjacent devices, even if the scribe is arranged to cut partially into the underlying semiconductor material.

Laser processing has, on the other hand, been found to be much more easily controlled and therefore reproducible on a production basis. However, laser equipment is relatively expensive to install and operate. In addition, it has proven to be relatively slow and therefore costly in terms of man-power required to produce a given quantity of finished material. This is due to the large amount of scribing which must be performed to produce a commercial scale device. For example, a one foot by one foot module is typically scribed to form twenty-five individual cells. This requires cutting at least twenty-four scribe lines each one foot long for each layer of the device. The substrate must therefore be passed under the laser a total of seventy-two times during its various processing stages. Throughput could be increased by operating a plurality of lasers simultaneously but this is not considered practical in terms of increased capital cost and operating expense.

Thus, it is seen that there is a need for a practical, reproducible and preferably inexpensive process for scribing the various layers used in thin film solar cells.

SUMMARY OF THE INVENTION

A thin film which has been deposited on a substrate to form a solar cell is scribed according to the present invention by means of a liquid jet of etching solution which is brought into contact with the thin film and moved along the desired scribe line while the etching solution is activated by means of an electrical current passing through the jet and the thin film to be scribed. The etching solution comprises an aqueous solution of a material which is selected and provided in sufficient concentration to provide electrical conductivity to the solution and to form soluble reaction products with the film being scribed, but which is substantially nonreactive with the film in the absence of the electrical current.

BRIEF DESCRIPTION OF THE DRAWINGS

The present invention may be better understood by reading the following detailed description of the preferred embodiments with reference to the accompanying drawings wherein.

DESCRIPTION OF THE PREFERRED EMBODIMENTS

Figure 1:
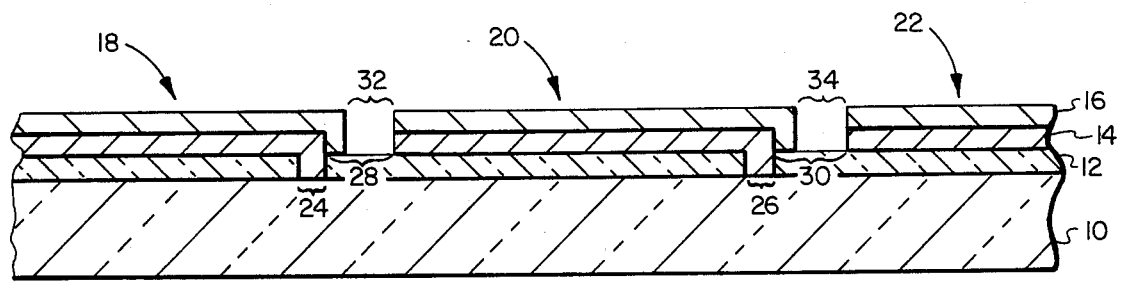
FIG. 1 is a cross-sectional illustration of a series connected thin film solar cell module according to the present invention.

With reference now to FIG. 1, there is illustrated the basic series connected thin film solar cell structure which is the subject of the present invention. The illustrated structure is intended to be essentially the same as that illustrated by the Hanak and Tyan et al references. This structure is preferably formed on a glass substrate 10 which may be on the order of two millimeters thick. A transparent conductor, TC, layer 12 comprising primarily tin oxide is deposited directly on substrate 10. Layer 12 is typically on the order of 2000 angstroms thick. An active semiconductor layer 14 is then deposited over layer 12. Layer 14 may comprise, for example, a p-i-n amorphous silicon structure having an overall thickness of 4000 to 5000 angstroms. Compound semiconductor structures, including such materials as copper indium diselenide and cadmium sulfide, may also be used as the active device within the scope of the present invention. A back contact layer 16 is deposited over the active structure 14. Layer 16 may be, for example, aluminum sputtered to a thickness of 1000 angstroms or more. However, if desired, a TC layer may be substituted for the metallic back contact. That is, both layers 12 and 16 may be transparent if desired or either may be formed from metal depending upon which direction light is to be received from.

As implied from the description so far, layers 12, 14 and 16 are each deposited upon substrate 10 and the underlying layers as continuous sheets of material. Portions of three separate solar cells 18, 20 and 22 are illustrated in the FIGURE. The three cells 18, 20 and 22 are formed and are serially connected by appropriate scribing of sheets 12, 14 and 16 during the manufacturing process. Thus, after deposition of layer 12, scribe lines are formed at 24 and 26. As can be seen from the FIGURE, the term scribe line or scribing as used herein means the complete removal of a layer at least down to the surface of the immediately underlying layer or substrate as appropriate. After scribes 24 and 26 are formed, the layer 14 is deposited over the scribed layer 12. As a result, portions of layer 14 filled in the scribe lines 24 and 26. After deposition of layer 14, additional scribes 28 and 30 are formed to separate layer 14 into individual segments, one for each of the cells 18, 20 and 22. Scribe lines 28 and 30, as illustrated, remove the layer 14 down to the upper surface of layer 12. After layer 16 is deposited over layer 14, and therefore into the scribe lines 28 and 30, additional scribe lines 32 and 34 are cut in layer 16. These final scribe lines 32 and 34 form individual back contacts for each of the cells 18, 20 and 22. The scribing process therefore generates the individual cells 18, 20 and 22 and provides serial electrical connection therebetween. For example, it can be seen that the front face contact of cell 20, that is its portion of layer 12, is connected to the back face contact of cell 18, that is its portion of layer 16, on the left edge of cell 20. Likewise the back face contact of cell 20 contacts the front face contact of cell 22 on the right side of cell 20.

Variations in the positioning and number of the scribe lines can be made within the scope of the present invention. For example, in some known structures, the above described scribe lines 28 and 30 are not actually formed. That is, by proper placement and control of scribe lines 32 and 34, both layers 14 and 16 can be properly cut in one step to result in a desired overall structure. In other known structures layer 14 is not scribed at all. For various reasons, such as differences in mechanical and chemical properties of various layers used in particular devices, it may however be more practical to perform the three separate scribing steps as described above.

Figure 2:
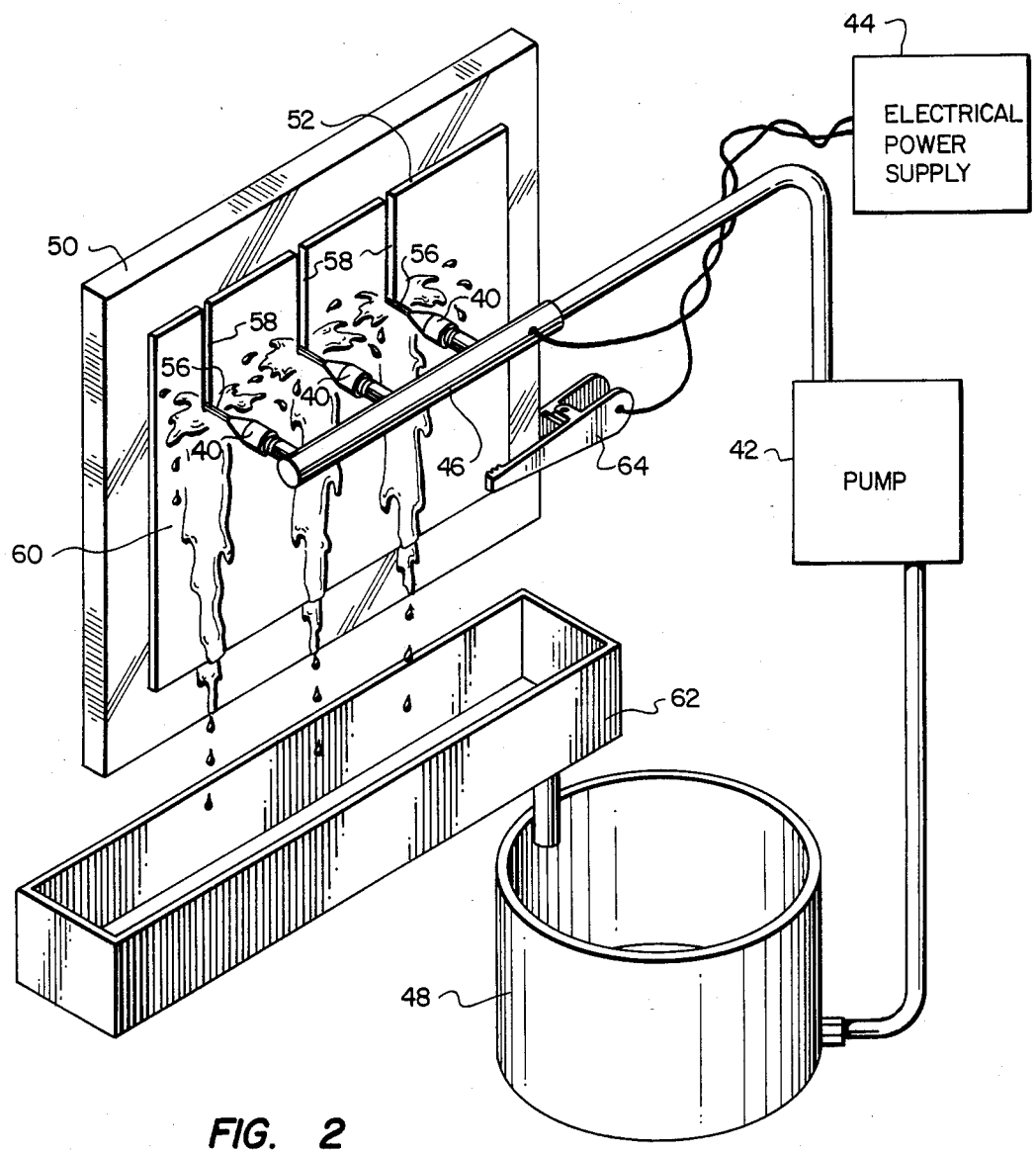
FIG. 2 is a partially perspective view of multi-jet scribing apparatus used in the present invention.

With reference now to FIG. 2, there is illustrated liquid jet processing apparatus useful in the present invention. This apparatus is much more reliable and provides more reproducible results than a mechanical scribing device, and is much less expensive and less difficult to operate than a laser scribing device. The primary elements of this apparatus include one or more liquid jet nozzles 40, a liquid pump 42 and a DC electrical power supply 44. In the preferred embodiment, a plurality of jet nozzles 40 are positioned in a line and connected by appropriate tubing to a manifold 46 for providing a etching solution to the nozzles. The pump 42 supplies an etching fluid from a storage tank 48 to the manifold 46 under appropriate pressure. The nozzles 40 are positioned normal to the face of a substrate 50 which, as illustrated, has a thin film 52, for example transparent conductor, which is to be scribed into a plurality of isolated strips. The fluid provided by pump 42 passes through manifold 46 to nozzles 40 which produce very small diameter, for example 0.002 inch, jets 56 of liquid which impinge upon the film 52 along desired scribe lines 58. Means are provided for moving either the substrate 50 or the nozzles 40 so that the scribe lines 58 may be formed across the entire width of substrate 50. After impinging upon the substrate 50, the liquid from jets 56 runs down the face of substrate 50 as illustrated at 60 and is collected in a trough 62 to be returned to the liquid storage tank 48 or disposed of.

The DC power supply 44 is connected between the liquid entering nozzles 40 and the thin film 52 on substrate 50. As illustrated, this electrical connection may be made by providing a direct contact to manifold 46 if this manifold is made of a conductive material such as metal. Electrical contact may be made to the film 52 by means of an alligator clip 64 attached to one edge of substrate 50 and in contact with the film 52.

By appropriate choice of etching liquids, electrical current and other operating conditions, we have found it possible to cut very well-defined scribe lines, that is lines with smooth edges and no loose fragments or remaining particles of material bridging the scribe. We have found that with a nozzle diameter of 0.002 inch and etching fluid flow rate of about 0.8 cc/minute, scribe lines of 0.0025 inch can be cut at a rate of about one inch per second. Using the methods of the present invention, these results are achieved while using etching liquids which under normal conditions are essentially nonreactive with the material being etched.

For example, we have found that the back contact layer 16, when formed from aluminum, may be scribed using a liquid with a very low concentration of nitric acid or common table salt. Thus, we have used solutions of five percent nitric acid or six to ten percent sodium chloride in water and found that they easily cut through the aluminum layer in our process. In the process, power supply 44 was adjusted to provide approximately 20 milliamps of current to the 0.002 inch liquid jet by adjusting the voltage up to 300 volts DC. However, both of these solutions are essentially nonreactive with the aluminum layer when contact is made without the flow of electrical current. Thus, as the fluid flows down the substrate 50, as illustrated at the point 60 in FIG. 2, there is essentially no removal of the film material. Instead, all of the etching reaction appears to be isolated precisely at the point of contact between the jets 56 and the film 52. Thus, the 0.002 inch diameter jet produces a scribe line having a width only 0.0005 inch wider than the jet.

The tin oxide material which is typically used for the transparent conductor 12 is mechanically quite hard and chemically quite nonreactive. Thus, as described above, mechanical scribing of tin oxide is quite difficult. Likewise, tin oxide is essentially unaffected by a 30% solution of hydrochloric acid in water. However, when this solution is used as described above, it very efficiently cuts clean scribe lines through tin oxide layers without adversely affecting other portions of the film or the substrate.

We have also found that the present invention may be used to scribe molybdenum deposited on glass as a back contact for heterojunction solar cells, such as copper indium diselenide/cadmium sulfide cells. A molybdenum film about two microns thick was scribed at a rate of 1.25 cm/second using a DC current of 43 ma and an etching fluid flow rate of 1.6 cc/minute through a 0.0055 inch nozzle. Three etching fluids were used under these conditions to provide scribe lines about 0.008 inch wide. One was a 30% solution of hydrochloric acid, HCl, in deionized water. Equivalent results were achieved by reducing the HCl concentration to the five to ten percent range and adding five to ten percent NaCl to the solution. Likewise good results were achieved by making up a solution of fifty grams of NaCl and fifty milliliters of nitric acid, $HNO_3$, in one liter of deionized water. Current levels as high as 100 ma were also used on molybdenum samples and were found to merely increase the etch rate.

As indicated above, it is possible to cut scribe lines which are only slightly wider than the nozzle diameter. Over etching, i.e. excessively wide scribes, is easily avoided by controlling current level and translation speed. For example, at a given rate of scribe cutting, say one inch per second, the electrical current level can be adjusted to completely remove the desired film along the scribe line without over etching. If scribe line width is too great the current level is decreased. Alternatively, the translation rate may be increased.

While the above examples involved the use of DC current, we have also achieved equivalent results with AC current. This was done by substituting a variable output transformer for the more expensive regulated high voltage power supply 44. We believe that etching with AC occurs only on the appropriate half cycles, but the results achieved were quite acceptable. Use of a full wave rectifying diode circuit with such a transformer would allow full wave etching with the less expensive equipment.

The FIG. 2 embodiment illustrates the substrate 50 in a vertical orientation which facilitates collection of the used etching fluid in trough 62. Early experiments where successfully performed with the substrate essentially horizontal. Such horizontal orientation may be preferred in production situations where the substrates are being carried on conveyor belts.

The materials used to assemble the apparatus illustrated in FIG. 2 must of course be selected to withstand the various operating fluids. One of the more important points in the apparatus is believed to be the nozzles 40. Since it is desirable to cut very narrow scribe lines to reduce the inactive area in the final solar cell product, it is preferred that the nozzles not erode during operation. In experimental setups, nozzles 40 were made of quartz. These nozzles are manufactured for use in ball bonding equipment normally used in attaching leads to semiconductor chip devices. The quartz material is of course essentially unaffected even by materials such as 30% hydrocloric acid.

In addition to controlling the inner diameter of nozzles 40, it is important, in a production situation where multiple nozzles are used, to monitor the flow of liquid through nozzles 40 and insure that each of the desired scribe lines is being properly cut. As indicated above, good results are achieved with about twenty to one hundred milliamps of current through each jet 56. We have found that if the liquid flow through a nozzle 40 is interrupted or reduced for any reason, a noticeable change in the current occurs. Therefore, by monitoring an ammeter which measures the flow of current from power supply 44, we believe it possible to automatically monitor proper liquid flow through nozzles 40.

As noted above, we have obtained good etching results using liquid solutions which would not normally be considered reactive with the films. It appears that the primary requirements for the etching solution are that it contain a material which provides appropriate electrical conductivity to the solution and which can form soluble reaction products with the film to be etched. In addition the etching solution should be essentially nonreactive with the film material in the absence of the electrical current.

While the present invention has been illustrated and described with respect to particular apparatus and methods of operation, it will be appreciated that various other modifications and variations can be made therein within the scope of the present invention as defined by the appended claims.

What is claimed is:

1. A method of scribing a thin film of aluminum deposited on a substrate to form part of a thin film solar cell comprising:
   contacting the thin film of aluminum along a desired scribe line with a jet of etching solution having a diameter of about 0.002 to about 0.008 inch while passing an electric current of about 0.020 to about 0.100 ampere through a circuit including said jet and said thin film, said etching solution comprising about 5 percent nitric acid in water.

2. A method of scribing a thin film of aluminum deposited on a substrate to form part of a thin film solar cell comprising:
   contacting the thin film of aluminum along a desired scribe line with a jet of etching solution having a diameter of about 0.002 to about 0.008 inch while passing an electric current of about 0.020 to about 0.100 ampere through a circuit including said jet and said thin film, said etching solution comprising about 6 percent to about 10 percent NaCl by weight dissolved in water.

3. A method of scribing a thin film of tin oxide deposited on a substrate to form part of a thin film solar cell comprising:
   contacting the thin film of tin oxide along a desired scribe line with a jet of etching solution having a diameter of about 0.002 to about 0.008 inch while passing an electric current of about 0.020 to about 0.100 ampere through a circuit including said jet and said thin film, said etching solution comprising about 30% hydrocloric acid by weight dissolved in water.

4. A method of scribing a thin film of molybdenum deposited on a substrate to form part of a thin film solar cell comprising:
   contacting the thin film of molybdenum along a desired scribe line with a jet of etching solution having a diameter of about 0.002 to about 0.008 inch while passing an electric current of about 0.020 to about 0.100 ampere through a circuit including said jet and said thin film, said etching solution comprising about 5 percent to 10 pcercent hydrocloric acid acid and about 5 percent to 10 percent NaCl dissolved in water.

5. A method of scribing a thin film of molybdenum deposited on a substrate to form part of a thin film solar cell comprising:
   contacting the thin film of molybdenum along a desired scribe line with a jet of etching solution having a diameter of about 0.002 to about 0.008 inch while passing an electric current of about 0.020 to about 0.100 ampere through a circuit including said jet and said thin film, said etching solution comprising about 5 percent nitric acid and about 5 percent to 10 percent NaCl dissolved in water.

* * * * *